United States Patent [19]
Yoon et al.

[11] Patent Number: 5,583,356
[45] Date of Patent: Dec. 10, 1996

[54] CONNECTOR ARRANGEMENT FOR A SEMICONDUCTOR MEMORY DEVICE

[75] Inventors: Joo-young Yoon, Euiwang; In-ho Nam, Suseong-gu, both of Rep. of Korea

[73] Assignee: Samsung Electronics Co., Ltd., Suwon, Rep. of Korea

[21] Appl. No.: 158,851

[22] Filed: Nov. 29, 1993

[30] Foreign Application Priority Data

Nov. 27, 1992 [KR] Rep. of Korea .................. 92-22570

[51] Int. Cl.⁶ .................. H01L 27/108; H01L 29/76; H01L 29/94; H01L 31/119
[52] U.S. Cl. .................. 257/296; 257/306; 257/308; 257/368; 257/401
[58] Field of Search .................. 257/296, 306, 257/308, 368, 401

[56] References Cited

U.S. PATENT DOCUMENTS 5,386,382  1/1995  Ahn .................. 365/174

OTHER PUBLICATIONS

Kimura et al., "A New Stacked Capacitor DRAM Cell Characterized by a Storage Capacitor on a Bit-line Structure," (IEDM 1988) pp. 596–599.

*Primary Examiner*—Ngân V. Ngô
*Attorney, Agent, or Firm*—Cushman Darby & Cushman L.L.P.

[57] ABSTRACT

In a semiconductor memory device having a novel structure of a wiring layer and a large capacitance capacitor and the manufacturing method therefor, on the transistor formed on the semiconductor substrate, a first conductive layer is formed extending along with the gate electrode of the transistor and connecting with the gate electrode, a storage electrode of a capacitor is formed on the first conductive layer by interposing the insulation film between the first conductive layer and the source region of the transistor, and a second conductive layer is formed in connection with the first conductive layer at a portion between memory cell array and the peripheral circuit region. Storage electrodes can be made thicker without affecting to the step-difference between memory cells and the peripheral circuit region, so that a more reliable semiconductor memory device with a capacitor having a larger capacitance can be realized.

5 Claims, 8 Drawing Sheets

CONNECTOR ARRANGEMENT FOR A SEMICONDUCTOR MEMORY DEVICE

BACKGROUND OF THE INVENTION

The present invention relates to a semiconductor memory device and the manufacturing method therefor, and more particularly to a semiconductor memory device having a novel structure of metal wiring layer and a capacitor of a large capacitance and the manufacturing method therefor.

In a dynamic random access memory (DRAM), increasing cell capacitance contributes to the enhancement of the read-out capability of the memory cells, as well as reducing the soft error ratio. DRAM integration has increased fourfold in the last three years, but the chip-size has only increased 1.4 times. As a result, the size of the memory has decreased to one third the previous size. Since substantially the same cell capacitance has been required for unit cell, the electrical characteristic of the memory cells has tended to degrade.

Therefore, a variety of structures have been suggested to form a three-dimensional structure of capacitor for ensuring a sufficiently large cell-capacitance within a limited area. Examples of the structures include trench capacitor, stack capacitor, and stack-trench capacitor.

The trench capacitor is excellent for ensuring large cell-capacitance, but the device characteristic is degraded due to the leakage current between trenches and the parasitic transistor, such as a MOS transistor, existing on the surface of the trench. Also, the manufacturing process is very difficult. A stack capacitor results in fewer parasitic transistors in comparison with that of the trench capacitor, and therefore, manufacturing is more simple in comparison. However, stack capacitors also are restricted by lithography limitations and this makes it difficult to obtain sufficient cell-capacitance.

Hitachi published a paper entitled "A New Stacked Capacitor DRAM Characterized by a Storage Capacitor on a Bit-line Structure" (IEDM 1988), wherein a new stacked capacitor cell, which is termed a diagonal active stacked capacitor cell with a highly-packed storage node (DASH), was introduced to form the storage capacitor on the bit-line.

Figure 1:
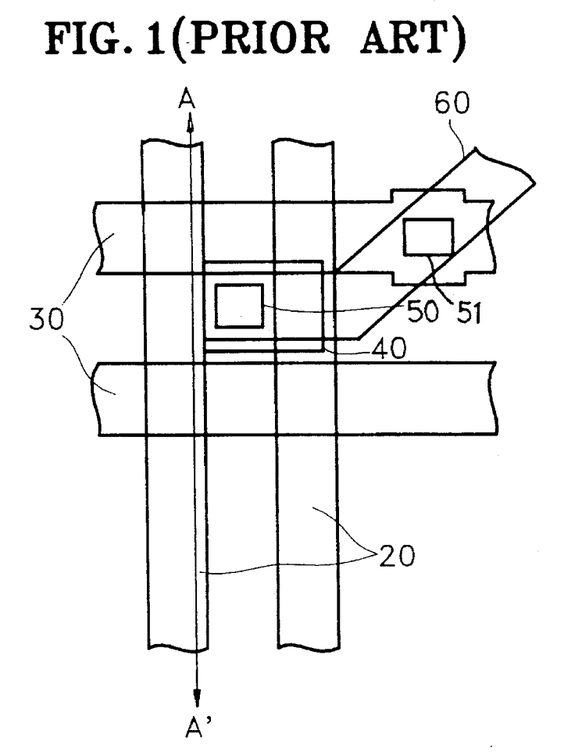
FIG. 1 is a layout diagram showing the conventional semiconductor memory device.

FIG. 1 is a lay-out diagram showing the aforementioned DASH, highlighting the memory-cell part neighboring on the peripheral circuit region. Reference numeral 20 indicates a word-line, 30 indicates a bit-line, 40 indicates a storage electrode of a capacitor, 50 indicates a storage node contact, 51 indicates a bit-line contact, and 60 indicates an active region. As shown in the drawings, the aforementioned active region 60 is positioned diagonally between word-line 20 and bit-line 30. After forming the bit-line, the diagonally formed active region is utilized to maintain the bit-line pitch as narrow as possible, to form a storage node contact on the substrate.

Figure 2:
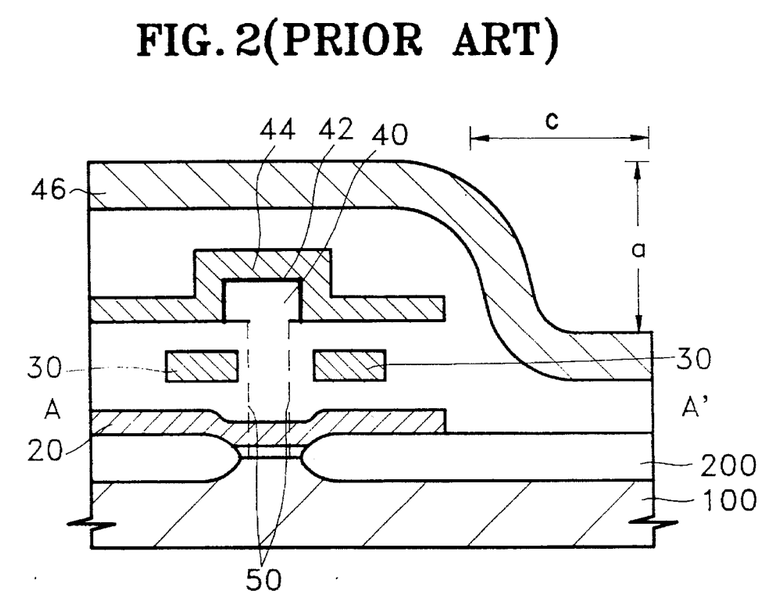
FIG. 2 is a sectional view of the conventional semiconductor memory device along with the line A—A' of FIG. 1.

FIG. 2 shows the sectional view of the semiconductor device of FIG. 1 along with the line A—A'. In FIG. 2, the peripheral circuit region is denoted by "c". Reference numeral 100 indicates a semiconductor substrate, 200 indicates a field oxide film, 42 indicates a dielectric film of a capacitor, 44 indicates a plate electrode of the capacitor, and 46 indicates a metal wiring, respectively. The same reference numerals are used to denote like parts of FIG. 1.

FIGS. 3 through 9 show the sectional views illustrating the manufacturing method of the aforementioned DASH.

Figure 3:
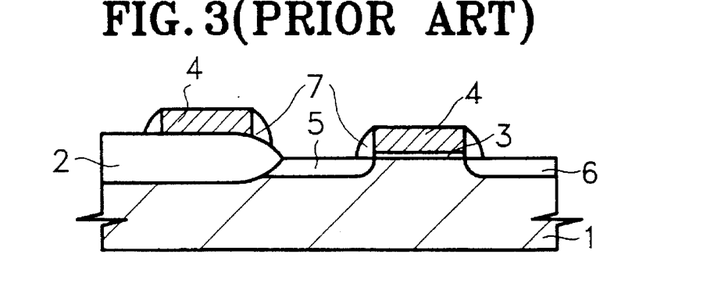
FIGS. 3 through 9 are the sectional views illustrating the conventional method for manufacturing a semiconductor memory device.

FIG. 3 illustrates forming a semiconductor substrate 1 which is divided into two parts, i.e., an active region and an isolation region, a gate oxide film 3 and a gate electrode 4. An impurity is then implanted to form source region 5 and a drain region 6. Next, an oxide film is deposited and antisotropically etched, to form a spacer 7 on the sidewall of the gate electrode 4.

Figure 4:
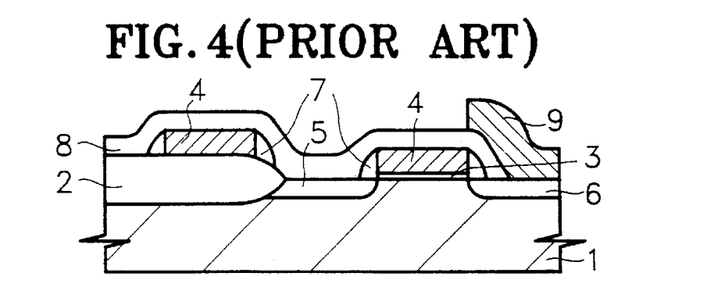

Thereafter, as shown in FIG. 4, a first oxide film 8 is deposited as the first insulation film for the memory cell transistor. A mask pattern (not shown) is then applied to form the first contact hole connecting the bit-line with the drain region of the transistor, which thereby partially etches first oxide film 8 on drain region 5 to form a first contact hole and then forms bit-line 9.

Figure 5:
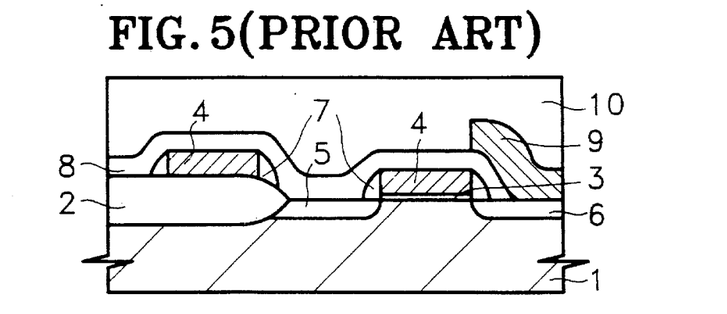
Figure 6:
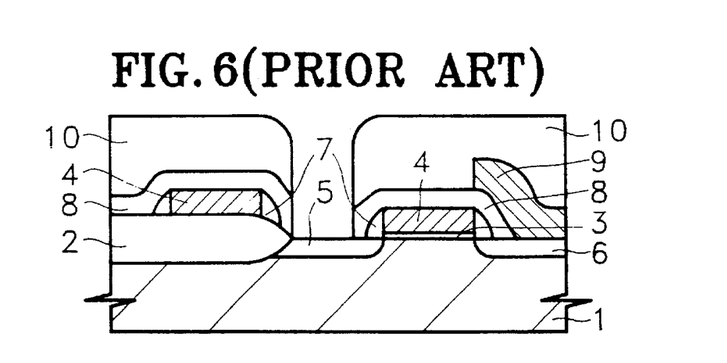

Next, as shown in FIG. 5, a second oxide film 10 is deposited as the second insulation film for insulating the bit-line. Then, a mask pattern (not shown) is applied to form the second contact hole shown in FIG. 6 for connecting the storage electrode of the capacitor with the source region of the transistor. Therefore, second oxide film 10 and first oxide film 8 deposited on source region 5 are partially etched to form the second contact hole.

Figure 7:
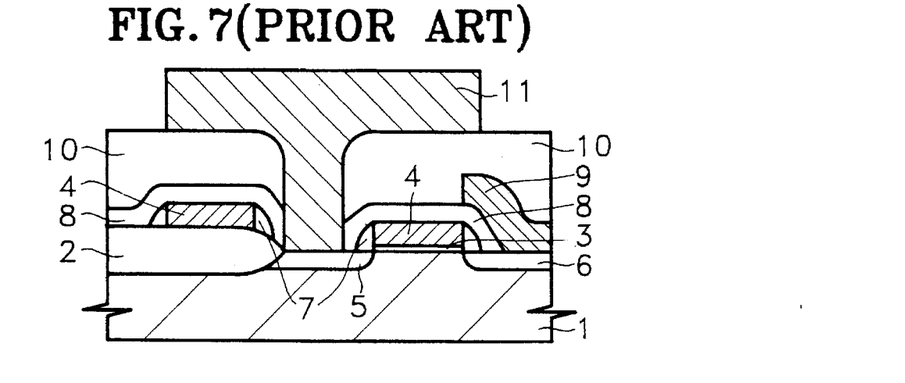

A polysilicon is then deposited, as shown in FIG. 7, for forming and etched to form a storage electrode 11.

Figure 8:
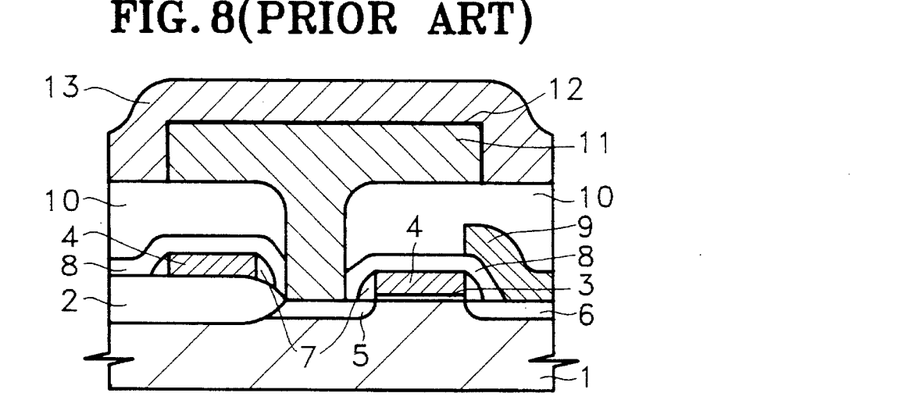

Next, as shown in FIG. 8, a high dielectric material such as oxide/nitride/oxide (ONO) is deposited on the surface of storage electrode 11 to form a dielectric film 12, whereon a polysilicon is deposited for forming a plate electrode of a capacitor. Then, the polysilicon is patterned to form a plate electrode 13.

Figure 9:
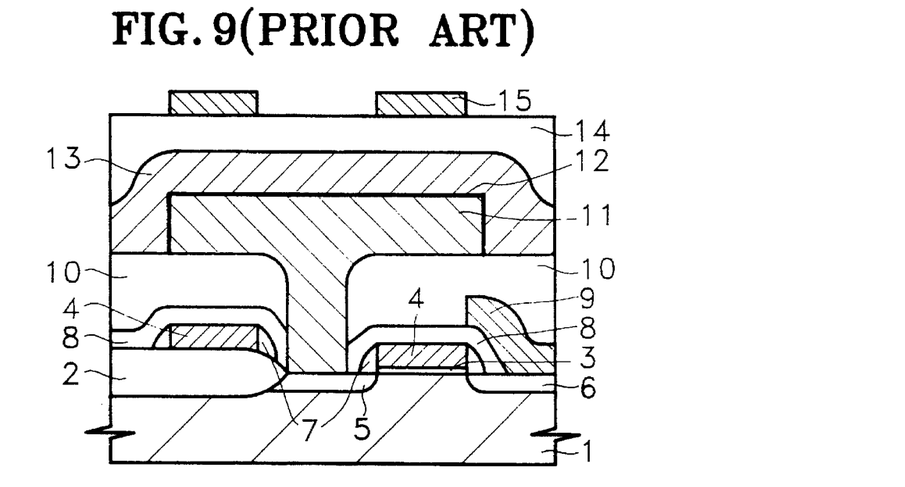

FIG. 9 illustrates a third oxide film 14 deposited as the third insulating film for insulating plate electrode 13, and then a metallic material deposited on third oxide film 14. Thereafter, the metallic material layer is patterned to form a metal wiring 15.

In the DASH structure, because the storage electrode is formed on the bit-line, the size of the storage node is maximized to the limits of lithography so that a large cell-capacitance can be ensured. However, as shown in FIG. 2, part of the memory cell has a large step-difference "a" near the peripheral circuit portion. The large step-difference makes it difficult to form metal wiring 46 (FIG. 2) uniformly. Further, if a thick storage electrode is formed to increase the capacitance of the capacitor, the memory cell area is formed even higher, so that the step-difference with respect to the peripheral circuit region becomes greater. Accordingly, a uniformly thick metal wiring becomes impossible to achieve and uniform patterning of the metal wiring is difficult, which thereby deteriorates the reliability of the semiconductor memory device.

SUMMARY OF THE INVENTION

Therefore, an object of the present invention is to provide a semiconductor memory device having a large cell-capacitance and the manufacturing method therefor.

Another object of the present invention is to provide a reliable semiconductor memory device and the manufacturing method therefor.

According to the present invention, a metal wiring layer is formed before the formation of the capacitor of the semiconductor memory device, so that the step-difference can be reduced between the memory cell region and the peripheral circuit region. Also, the thickness of the storage electrode of the capacitor does not influence the step-difference. Therefore, the capacitance of the capacitor can be significantly increased by varying the thickness of the storage electrode. Accordingly, a large-capacitance and reliable semiconductor memory device can be realized.

BRIEF DESCRIPTION OF THE DRAWINGS

These and other objects, features, aspects and advantages of the present invention will become more apparent from the following detailed description of the present invention when taken in conjunction with the accompanying drawings, in which:

FIGS. 12A through 18A are the sectional views illustrating a preferred embodiment of the present invention along with line C—C' of FIG. 10, showing a method of manufacturing a semiconductor memory device; and FIGS. 12B through 18B are the sectional views illustrating a preferred embodiment of the present invention along with line B—B' of FIG. 10, showing a method of manufacturing a semiconductor memory device.

DETAILED DESCRIPTION OF THE PREFERRED EMBODIMENT OF THE PRESENT INVENTION

Figure 10:
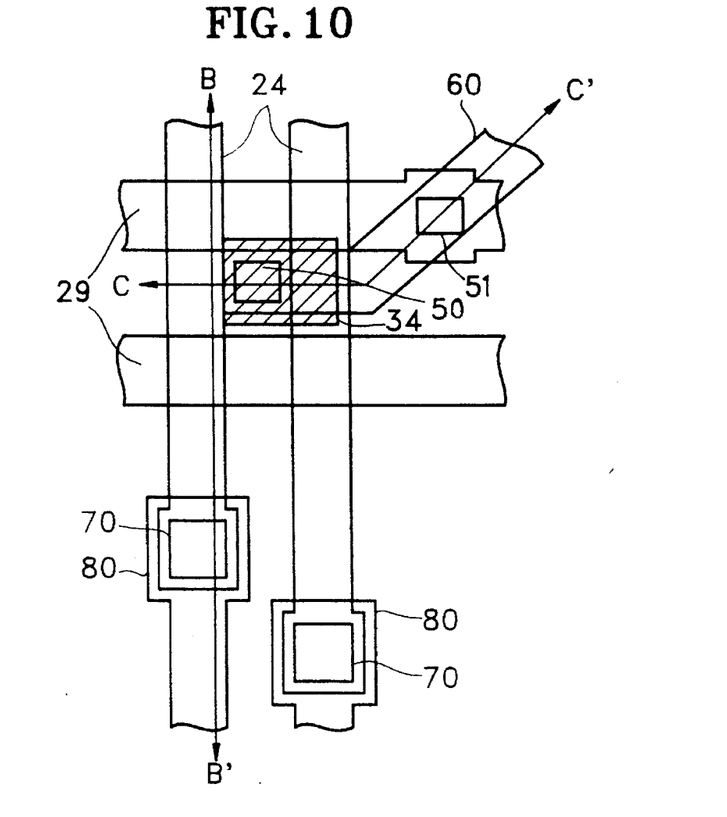
FIG. 10 is a layout diagram showing a semiconductor memory device according to the present invention.

FIG. 10 is a layout diagram of the memory cell of a semiconductor memory device according to the present invention, particularly showing a portion connecting the memory cell area with the peripheral circuit regions. Referring to FIG. 10, reference numeral 24 denotes a word-line, 29 denotes a bit-line, 32 denotes a first metal wiring layer, 34 denotes the storage electrode of the capacitor, 50 denotes a storage node contact, 51 denotes a bit-line contact, 52 denotes a first metal wiring layer contact hole 60 denotes an active region, 70 denotes a metal contact, and 80 denotes a metal wiring layer in the peripheral circuit region, respectively.

Figure 11:
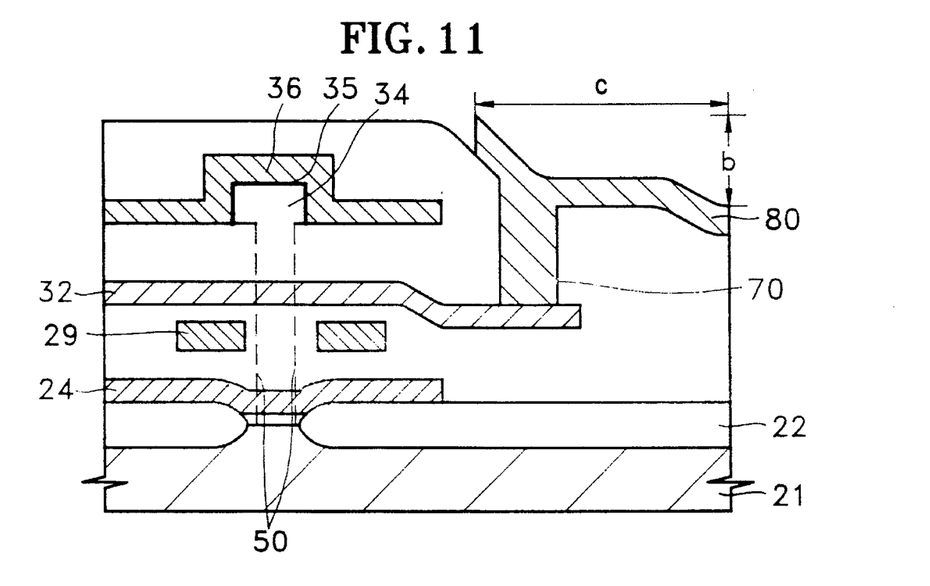
FIG. 11 is a sectional view of a semiconductor memory device along with the line B—B' of FIG. 10.

FIG. 11 is a sectional view along with the line B—B' of FIG. 10, in which like sections are denoted by the same reference numerals. Reference numeral 21 denotes a semiconductor substrate, 22 denotes a field oxide film, 35 denotes a dielectric film of a capacitor, 36 denotes a plate electrode of the capacitor, and 32 denotes a first metal wiring layer and especially indicates a word-line-strapping metal wiring layer. For the conventional DRAM cells, the word-line-strapping metal wiring layer is formed above and parallel with the word-line and connected with the word-line through contact holes. The metal wiring layer is in a parallel connection with the word-line comprised of polysilicon, which reduces the resistance of the word-line.

In comparison with the conventional memory cell shown in FIG. 1, the semiconductor memory device of the present invention has a structure in which first metal wiring layer 32 is formed above the word-line 24 and metal contact 70 is formed on first metal wiring layer 32 in the peripheral circuit region C. Thus, second metal wiring layer 80 in the peripheral circuit region C connects with first metal wiring layer 32 via metal contact 70. Accordingly, the step-difference "b" is very small between the memory cell and the peripheral circuit region. Even if the storage electrode 34 is formed to be thick to ensure larger capacitance, step-difference b is not affected. At this time, first metal wiring layer 32 may be not only the word-line-strapping metal wiring layer, but also the bottom-most metal wiring layer of the multi-layer wiring of the semiconductor memory device. Also, since first metal wiring layer 32 is formed prior to the formation of the capacitor, the metal wiring layer may be melted in the subsequent high temperature processes, i.e., a deposition process of the capacitor electrode material, or a planarizing process. Therefore, the metal wiring layer should be formed by the use of refractory metals having a high melting point, e.g., tungsten (W) or titanium (Ti).

FIGS. 12A through 18A and FIGS. 12B through 18B are the sectional views showing a preferred method for manufacturing the semiconductor memory device according to the present invention. Here, FIGS. 12A–18A show sectional views along with the line C—C' of FIG. 10, and FIGS. 12B–18B show sectional views along with the line B—B' of FIG. 10.

Figure 12A:
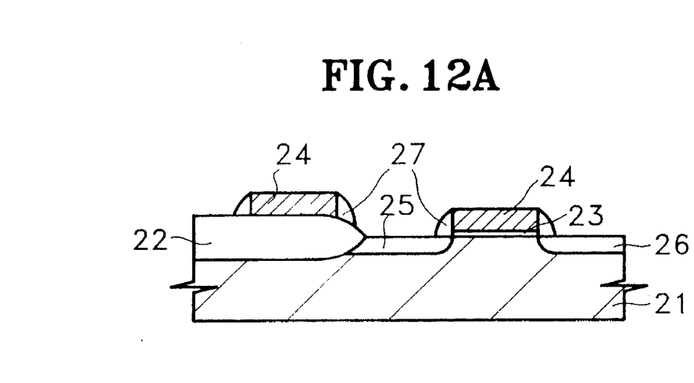
Figure 12B:
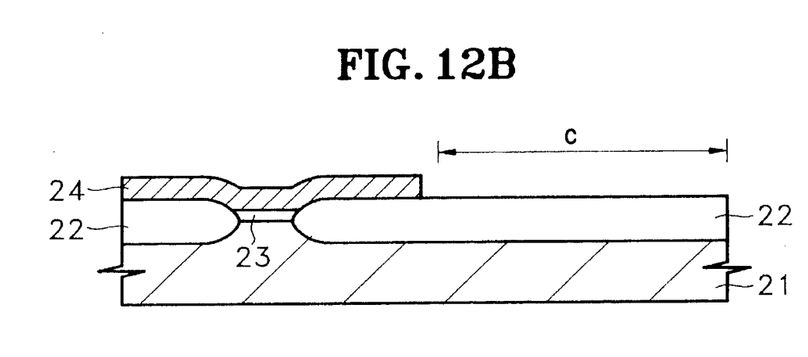

FIGS. 12A and 12B show a step for forming a transistor. In FIG. 12B the peripheral circuit region is denoted by "c". Gate oxide film 23 is formed on a semiconductor substrate 21, which is divided into two parts, i.e., active region and isolation region, by a field oxide film 22, and then a polysilicon doped with an impurity is deposited to the thickness of about 500–1,500 Å and etched using a mask pattern (not shown) to form the gate electrode 24 of the transistor. Next, an impurity is implanted to form a source region 25 and a drain region 26. Thereafter, an insulating material, for example, an oxide is deposited and then is isotropically etched, to thereby form a spacer 27 on the sidewall of gate electrode 24.

Figure 13A:
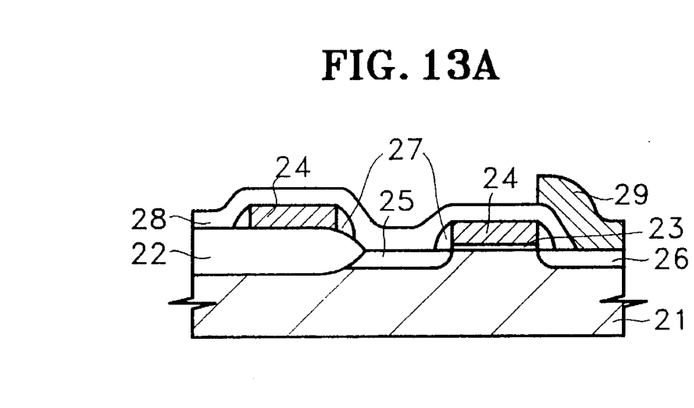
Figure 13B:
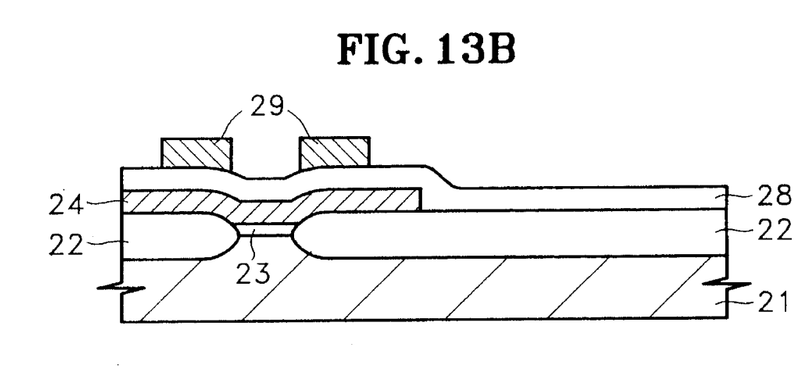

FIGS. 13A and 13B show a step for forming a bit-line. A first insulating film is deposited for insulating the transistors, to form an oxide film 28 used to etch a thickness of about 1,000–1,500 Å. Next, a mask pattern (not shown) is used to etch a first contact hole in the oxide film 28 at drain region 26 for connecting the bit-line with the drain region of the transistor. Thereafter, conductive materials such as impurity-doped polysilicon and tungsten silicide (WSix) are in turn deposited to the thickness about 500–1,000 Å respectively. A another mask pattern (not shown) is then applied for forming the bit-line to pattern the conductive layers, to thereby form bit-line 29.

Figure 14A:
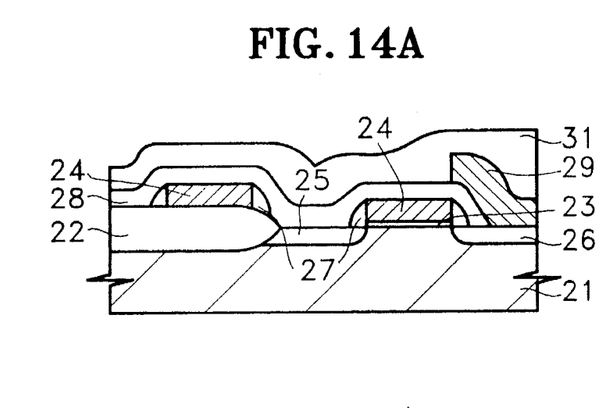
Figure 14B:
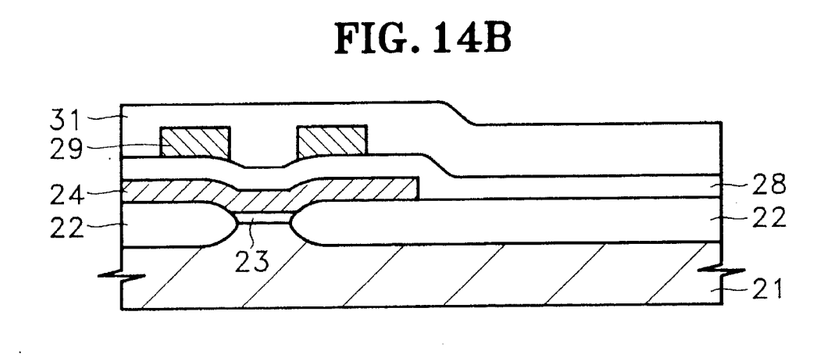

FIGS. 14A and 14B show a step for forming a first planarization layer. To planarize the surface of the semiconductor substrate which becomes rugged by the steps of the manufacturing of bit-line, a first borophosphor silicate glass (BPSG) layer 31, for example, is deposited as the first planarization layer, and then the wafer is heat-treated in the nitrogen ($N_2$) atmosphere at a temperature of 850°–900° C. for 30–120 minutes, to thereby planarize the surface of the semiconductor substrate.

Figure 15A:
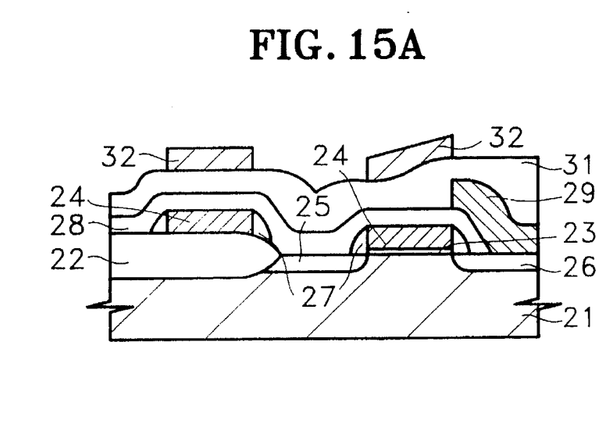
Figure 15B:
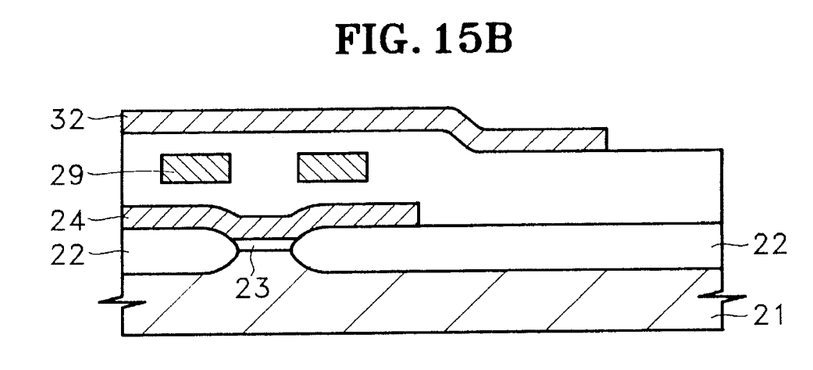

FIGS. 15A and 15B show a step for forming a first conductive layer. A mask pattern (not shown) is used to etch a second contact hole 52 in oxide film 28 and BPSG layer 31 deposited on gate electrode 24 for connecting the first conductive layer with the gate electrode of the transistor. Next, a first conductive material, for example, tungsten, is deposited to the thickness of about 500–1,500 Å, by the sputtering method or chemical vapor deposition (CVD) method, to form first conductive layer 32, which contacts gate electrode 24 and extends latitudinally above gate electrode 24. At this time, first conductive layer 32 may be patterned from the memory cell array region to the peripheral circuit region (refer to FIG. 15B). Here, first conductive layer 32 can be used not only for strapping the word-line as shown in FIG. 11 and is for the bottom-most metal wiring in the multilayer wiring.

Figure 16A:
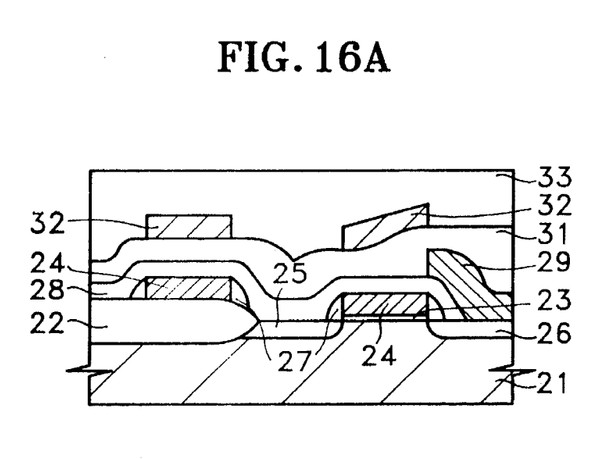
Figure 16B:
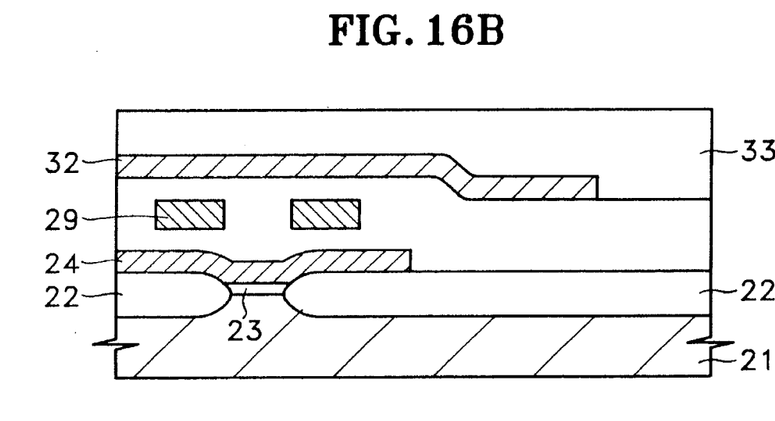

FIGS. 16A–16B show a step for forming a second planarization layer. After a second planarization layer 33, for example, a second BPSG layer, is deposited to form first conductive layer 32. The wafer is again heat-treated in the nitrogen atmosphere for a duration of 30–120 minutes at a temperature of 800°–900° C., to thereby planarize the surface of the substrate.

Figure 17A:
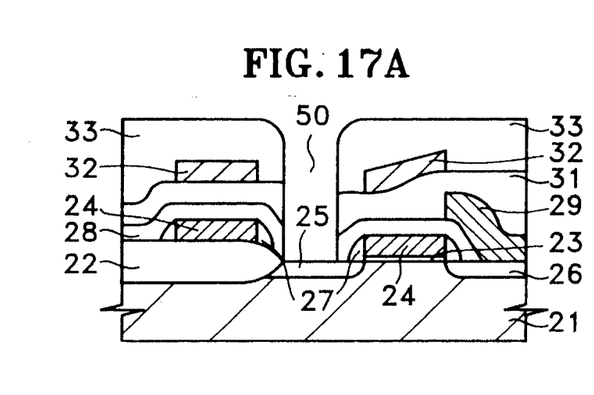

FIG. 17A shows a step for forming a third contact hole for connecting a storage electrode of a capacitor with the source region of the transistor. A mask pattern (not shown) is used to etch second and first BPSG layers 33 and 31 and oxide film 28 which are deposited on the source region 14 to form the third contact hole. Accordingly, third contact hole 50 for connecting the storage electrode of a capacitor with the source region of a transistor is formed.

Figure 18A:
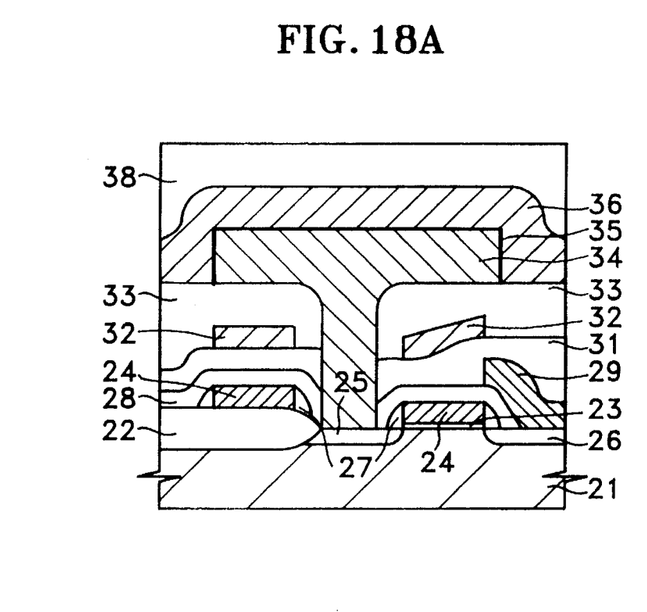
Figure 18B:
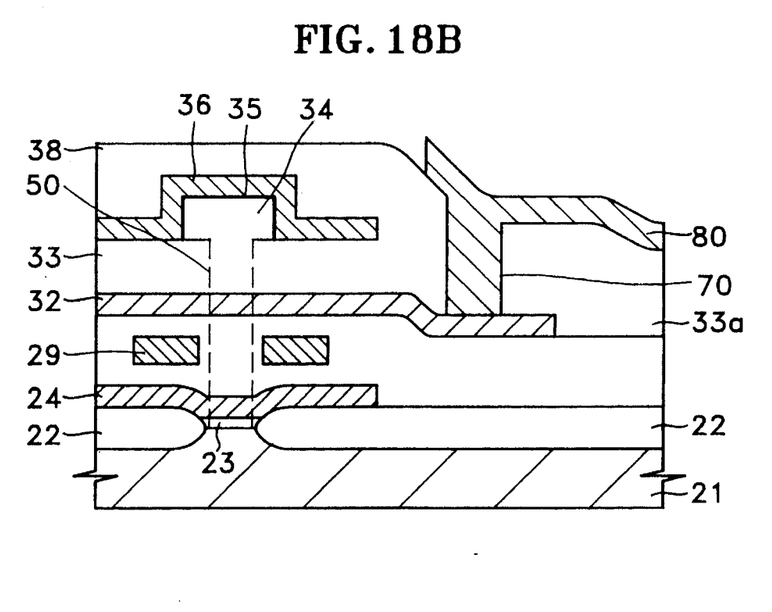

FIGS. 18A and 18B show a step for forming a capacitor and a second conductive layer. A conductive material, for example, an impurity-doped polysilicon, is deposited to the thickness of 3,000–6,000 Å, and then a mask pattern (not shown) is used for forming a storage electrode 34 of a capacitor. Next, a dielectric material, for example, oxide/nitride/oxide (ONO) film, is coated on the surface of the storage electrode 34 to a thickness less than 100Å, to thereby form dielectric film 35. Then, a conductive material, i.e., the impurity-doped polysilicon, is deposited to the thickness of about 1,000–2,000 Å on the whole surface of the resultant structure. Next, a mask pattern (not shown) is used to form a plate electrode 36 of the capacitor. As a result, a capacitor is completed comprising storage electrode 34, dielectric film 35 and plate electrode 36. Then, to insulate plate electrode 36, an insulating film 38 is formed on the resultant structure. Then, a mask pattern (not shown) is used to form a fourth contact hole 70 connecting a second conductive layer, which will be formed on the peripheral region with the first conductive layer. Thereafter, a conductive material, for example, aluminum, is deposited and patterned to fill the fourth contact hole 70 and form second conductive layer 80. Here, second conductive layer 80 is a metal wiring layer formed on the peripheral circuit region and is connected to the first conductive layer via fourth contact hole 70.

According to the preferred embodiment of the present invention, formation of the metal wiring layer prior to the storage electrode of a capacitor can reduce the step-difference between the memory cell array region and the peripheral circuit region. Since the thickness of the storage electrode can be increased without the increase of the step-difference, a large cell capacitance can be ensured.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A connector arrangement for a semiconductor memory device having a memory cell array comprising a plurality of memory cells on a semiconductor substrate and a peripheral circuit region formed on the periphery of said memory cell array, a memory cell adjacent said peripheral circuit region having a transistor comprised of a source region and a drain region disposed in said substrate, and a gate electrode and a capacitor disposed substantially above said transistor comprised of a storage electrode, a dielectric film and a plate electrode, said connector arrangement comprising:

a first conductive layer formed above said transistor and connecting with said gate electrode through a first contact hole at a cell array edge;

a first insulating film formed on said first conductive layer;

a second contact hole formed on a portion of the source region of said transistor;

a storage electrode connector connecting with said source region of said transistor via said second contact hole to said storage electrode formed above said first insulating film; and a second conductive layer disposed in said peripheral circuit region and connected to first conductive layer at a portion where said memory cell array is adjacent said peripheral circuit region.

2. A connector arrangement according to claim 1, further comprising a second insulating film disposed between said transistor and said first conductive layer; and a bit-line connected to said drain region of said transistor.

3. A connector arrangement according to claim 1, wherein said first conductive layer is a word-line-strapping metal wiring layer.

4. A connector arrangement according to claim 1, wherein said first conductive layer is any one selected from the group consisting of tungsten and titanium.

5. A connector arrangement according to claim 1, wherein said second conductive layer is an aluminum layer.

* * * * *